(12) United States Patent
Li et al.

(10) Patent No.: US 11,930,587 B2
(45) Date of Patent: Mar. 12, 2024

(54) FLEXIBLE PRINTED CIRCUIT BOARD AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Fan Li, Beijing (CN); Hengzhen Liang, Beijing (CN); Yunhan Xiao, Beijing (CN); Lianbin Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/921,887

(22) PCT Filed: Jun. 7, 2021

(86) PCT No.: PCT/CN2021/098640
§ 371 (c)(1),
(2) Date: Oct. 27, 2022

(87) PCT Pub. No.: WO2021/249345
PCT Pub. Date: Dec. 16, 2021

(65) Prior Publication Data
US 2023/0164907 A1    May 25, 2023

(30) Foreign Application Priority Data

Jun. 10, 2020   (CN) .......................... 202010525689.5

(51) Int. Cl.
*H05K 1/02* (2006.01)
*G06F 3/041* (2006.01)
(Continued)

(52) U.S. Cl.
CPC ......... *H05K 1/0218* (2013.01); *G06F 3/0412* (2013.01); *H05K 1/028* (2013.01);
(Continued)

(58) Field of Classification Search
CPC ...... H05K 1/0218; H05K 1/028; H05K 1/144; H05K 1/147; H05K 2201/041; H05K 2201/10128; G06F 3/0412; G06F 3/0443
See application file for complete search history.

(56) References Cited

U.S. PATENT DOCUMENTS 6,506,978 B1    1/2003  Furihata
2005/0052858 A1  3/2005  Shima
(Continued)

FOREIGN PATENT DOCUMENTS

CN    1287285 A    3/2001
CN    1592570 A    3/2005
(Continued)

OTHER PUBLICATIONS

CN202010525689.5 first office action.
PCT/CN2021/098640 international search report.

*Primary Examiner* — Kenneth B Lee, Jr.
(74) *Attorney, Agent, or Firm* — IPro, PLLC

(57) ABSTRACT

Provided are a flexible printed circuit board and a display device. The flexible printed circuit board comprises a main flexible printed circuit board and a connection flexible printed circuit board having different outlines. Both printed circuit boards are single-layer boards or double-layer boards. The main flexible printed circuit board comprises a bonding region, a device mounting region, a first connection region and signal lines. The signal lines include a first signal line positioned between the device mounting region and the first connection region, and a second signal line positioned between the device mounting region and the bonding region. The connection flexible printed circuit board comprises a
(Continued)

second connection region, a third connection region and a third signal line positioned between the second connection region and the third connection region. The two flexible printed circuit boards are connected by means of the first connection region and the second connection region. An orthographic projection of the third signal line on the main flexible printed circuit board overlaps with the second signal line. In an overlapping region, an electromagnetic shielding structure is at least provided at one side of the main flexible printed circuit board facing the connection flexible printed circuit board or at one side of the connection flexible printed circuit board facing the main flexible printed circuit board.

18 Claims, 11 Drawing Sheets

(51) Int. Cl.
*H05K 1/14* (2006.01)
*G06F 3/044* (2006.01)

(52) U.S. Cl.
CPC ............ *H05K 1/144* (2013.01); *H05K 1/147* (2013.01); *G06F 3/0443* (2019.05); *H05K 2201/041* (2013.01); *H05K 2201/10128* (2013.01)

(56) References Cited

U.S. PATENT DOCUMENTS

| | | |
|---|---|---|
| 2008/0036049 A1 | 2/2008 | Lee et al. |
| 2020/0201506 A1 | 6/2020 | Chen |
| 2021/0212207 A1* | 7/2021 | Xiong ................. G06F 3/04164 |
| 2021/0335982 A1* | 10/2021 | Dong ..................... H10K 71/00 |

FOREIGN PATENT DOCUMENTS

| | | |
|---|---|---|
| CN | 203632967 U | 6/2014 |
| CN | 109375820 A | 2/2019 |
| CN | 111511098 A | 8/2020 |

* cited by examiner

FLEXIBLE PRINTED CIRCUIT BOARD AND DISPLAY DEVICE

CROSS REFERENCE TO RELATED APPLICATIONS

The application is a US National Stage of International Application No. PCT/CN2021/098640, filed on Jun. 7, 2021, which claims priority from Chinese Patent Application No. 202010525689.5, entitled "FLEXIBLE PRINTED CIRCUIT (FPC) BOARD AND DISPLAY APPARATUS", filed with the China National Intellectual Property Administration on Jun. 10, 2020, the entire contents of which are incorporated herein by reference.

TECHNICAL FIELD

The disclosure relates to the technical field of display, in particular to a flexible printed circuit board and a display apparatus.

BACKGROUND

In an existing organic light-emitting diode (OLED) touch display apparatus, a touch panel is often disposed outside an encapsulation layer. In order to realize simultaneous control of touch and display, a flexible printed circuit (FPC) board made of multiple layers is often used to realize circuit connection with a printed circuit board (PCB).

However, the existing flexible printed circuit board made of multiple layers has the technical problems of great manufacturing difficulty and high cost.

SUMMARY

In a first aspect, an embodiment of the disclosure provides a flexible printed circuit board, including: a main flexible printed circuit board and an adaptor flexible printed circuit board. The main flexible printed circuit board is a single-layer board or a double-layer board, and includes a bonding region configured for bonding with a display panel, a component arranging region configured for arranging a control component, a first connection region configured for connecting with an adaptor flexible printed circuit board, a first signal line disposed between the component arranging region and the first connection region, and a second signal line disposed between the component arranging region and the bonding region. The adaptor flexible printed circuit board has an outline different from an outline of the main flexible printed circuit board, and the adaptor flexible printed circuit board is a single-layer board or a double-layer board, and includes a second connection region configured for connecting with the main flexible printed circuit board, a third connection region configured for connecting with a printed circuit board, and a third signal line disposed between the second connection region and the third connection region. An orthographic projection of the second connection region on the main flexible printed circuit board completely falls within a region range of the main flexible printed circuit board, and an orthographic projection of the third connection region on a plane of the main flexible printed circuit board does not fall within the region range of the main flexible printed circuit board. The main flexible printed circuit board and the adaptor flexible printed circuit board are connected through the first connection region and the second connection region respectively, an orthographic projection of the third signal line on the main flexible printed circuit board and the second signal line has an overlapping region, and in the overlapping region, an electromagnetic shielding structure is at least disposed on a side of the main flexible printed circuit board facing the adaptor flexible printed circuit board or on a side of the adaptor flexible printed circuit board facing the main flexible printed circuit board.

In some embodiments, the main flexible printed circuit board includes a first substrate layer, a first conductive layer disposed on a first surface of the first substrate layer, and a second conductive layer disposed on a second surface of the first substrate layer opposite to the first surface. The first surface is a surface of the first substrate layer close to the adaptor flexible printed circuit board. The first conductive layer includes the first signal line, and the second conductive layer includes the second signal line. The electromagnetic shielding structure is disposed on the side of the main flexible printed circuit board facing the adaptor flexible printed circuit board, and in the overlapping region, the electromagnetic shielding structure includes a first conductive part disposed in the first conductive layer. The first conductive part is insulated from the first signal line, and the first conductive part is grounded.

In some embodiments, the adaptor flexible printed circuit board includes a second substrate layer, and a third conductive layer disposed on a third surface of the second substrate layer. The third surface is a surface of the second substrate layer facing away from the main flexible printed circuit board, and the third conductive layer includes the third signal line.

In some embodiments, the adaptor flexible printed circuit board includes a third substrate layer, a fourth conductive layer disposed on a fourth surface of the third substrate layer, and a fifth conductive layer disposed on a fifth surface of the third substrate layer opposite to the fourth surface. The fifth surface is a surface of the third substrate layer close to the main flexible printed circuit board, and the fourth conductive layer includes a third signal line. The electromagnetic shielding structure is disposed on the side of the adaptor flexible printed circuit board facing the main flexible printed circuit board, and in the overlapping region, the electromagnetic shielding structure includes a second conductive part disposed in the fifth conductive layer, and the second conductive part is grounded.

In some embodiments, in the overlapping region, the electromagnetic shielding structure includes a first electromagnetic shielding layer disposed on the side of the main flexible printed circuit board facing the adaptor flexible printed circuit board, and/or, a second electromagnetic shielding layer disposed on the side of the adaptor flexible printed circuit board facing the main flexible printed circuit board.

In some embodiments, a first covering film is disposed on the side of the main flexible printed circuit board facing the adaptor flexible printed circuit board, and the first electromagnetic shielding layer is disposed on a side of the first covering film close to the adaptor flexible printed circuit board.

In some embodiments, the first electromagnetic shielding layer is one or more of conductive rubber, conductive cloth, conductive foam or conductive shielding glue, and the second electromagnetic shielding layer is one or more of the conductive rubber, the conductive cloth, the conductive foam or the conductive shielding glue.

In some embodiments, the main flexible printed circuit board and the adaptor flexible printed circuit board are connected in the first connection region and the second connection region respectively through one of a board-to-board (BTB) connector, a zero-insertion-force (ZIF) connector and FOF bonding.

In some embodiments, a second covering film is disposed on a side of the second conductive layer facing away from the first substrate layer.

In some embodiments, a third covering film is disposed on a side of the third conductive layer facing away from the second substrate layer.

In a second aspect, an embodiment of the disclosure provides a display apparatus, including: a display panel, and a flexible printed circuit board. The flexible printed circuit board includes a main flexible printed circuit board and an adaptor flexible printed circuit board. The main flexible printed circuit board is a single-layer board or a double-layer board, and includes a bonding region configured for bonding with a display panel, a component arranging region configured for arranging a control component, a first connection region configured for connecting with an adaptor flexible printed circuit board, a first signal line disposed between the component arranging region and the first connection region, and a second signal line disposed between the component arranging region and the bonding region. The adaptor flexible printed circuit board has an outline different from an outline of the main flexible printed circuit board, and the adaptor flexible printed circuit board is a single-layer board or a double-layer board, and includes a second connection region configured for connecting with the main flexible printed circuit board, a third connection region configured for connecting with a printed circuit board, and a third signal line disposed between the second connection region and the third connection region. An orthographic projection of the second connection region on the main flexible printed circuit board completely falls within a region range of the main flexible printed circuit board, and an orthographic projection of the third connection region on a plane of the main flexible printed circuit board does not fall within the region range of the main flexible printed circuit board. The main flexible printed circuit board and the adaptor flexible printed circuit board are connected through the first connection region and the second connection region respectively, an orthographic projection of the third signal line on the main flexible printed circuit board and the second signal line has an overlapping region, and in the overlapping region, an electromagnetic shielding structure is at least disposed on a side of the main flexible printed circuit board facing the adaptor flexible printed circuit board or on a side of the adaptor flexible printed circuit board facing the main flexible printed circuit board.

In some embodiments, the display panel includes: pixel units arranged in an array, and a first functional line electrically connected with the pixel units. The first functional line is electrically connected with the third signal line on the flexible printed circuit board through the bonding region, and the first functional line is configured to receive a display signal from the flexible printed circuit board.

In some embodiments, the display panel further includes: a touch layer, disposed on a side of the pixel units away from a base substrate, and includes a plurality of first touch electrodes and a plurality of second touch electrodes; and a second functional line electrically connected with the first touch electrodes, and a third functional line electrically connected with the second touch electrodes. The second functional line is electrically connected with a first sub-line in the second signal line on the flexible printed circuit board through the bonding region, and the third functional line is electrically connected with a second sub-line in the second signal line on the flexible printed circuit board through the bonding region. One of the second functional line and the third functional line is configured to receive a touch signal, and the other of the second functional line and the third functional line is configured to send the touch signal.

DETAILED DESCRIPTION

Figure 1:
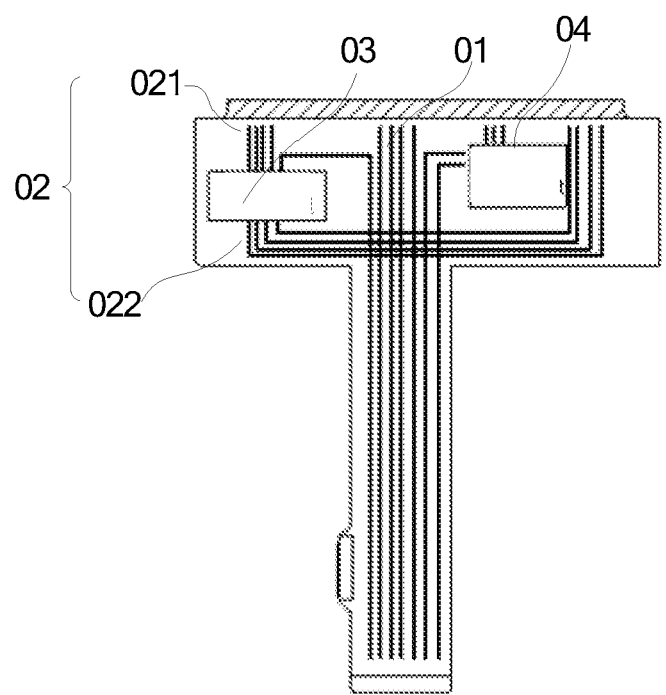
FIG. 1 is a schematic structural diagram of a flexible printed circuit board of six-layers.

To make the objectives, technical solutions and advantages of embodiments of the disclosure clearer, the technical solutions of the embodiments of the disclosure will be clearly and completely described below in conjunction with the accompanying drawings of the embodiments of the disclosure. Apparently, the described embodiments are only a part of the embodiments of the disclosure, not all of the embodiments. The embodiments of the disclosure and features in the embodiments can be combined with each other in the case of not conflicting. Based on the described embodiments of the disclosure, all other embodiments obtained by those of ordinary skill in the art without creative work shall fall within the protection scope of the disclosure.

Unless otherwise defined, technical or scientific terms used in the disclosure shall have the ordinary meanings understood by those ordinarily skilled in the art to which the disclosure pertains. The words "comprise" or "include" and the like used in the disclosure indicate that an element or item appearing before such word covers listed elements or items appearing after the word and equivalents thereof, and does not exclude other elements or items.

It needs to be noted that the sizes and shapes of all figures in the accompanying drawings do not reflect true scales, and are only intended to schematically illustrate the content of the disclosure. The same or similar reference numerals represent the same or similar elements or elements with the same or similar functions all the time.

Figure 2:
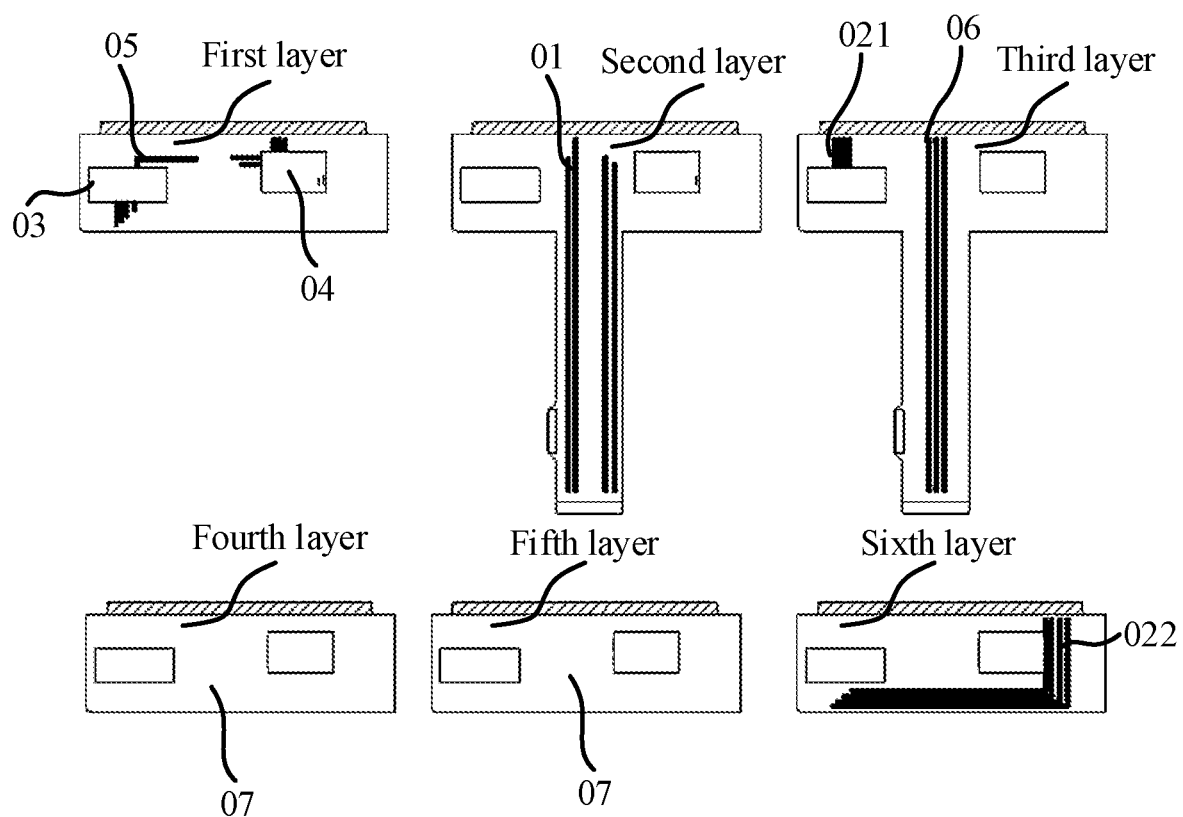
FIG. 2 is a schematic structural diagram showing the six-layers of the flexible printed circuit board shown in FIG. 1.

In the related art, a structure of a flexible printed circuit board made of six-layer board can be seen in in FIG. 1. In a general multilayer board, a GND layer is usually disposed between a power line 01 and a touch line 02 (including, for example, an Rx line 021 and a Tx line 022 shown in FIG. 1) to ensure the shielding between the two types of lines. FIG. 2 is a schematic diagram showing the six-layers of the board shown in FIG. 1. Specifically, a first layer includes a device line 05 connected with a touch driving device 03 and a display driving device 04, a second layer includes the power line 01, a third layer includes the Rx line 021 and a part of a display line 06, a fourth layer and a fifth layer include a shielding layer 07, and a sixth layer is the Tx line 022. The touch lines 02 in the third layer and the sixth layer pass over the power line 01 in the second layer, and the shielding between them is realized through the shielding layer 07 of the fourth layer and the fifth layer. Since the multilayer board usually includes four layers, six layers or even more layers, the flexible printed circuit board of the multilayer has the technical problems of complex manufacturing process and high manufacturing cost.

In view of this, embodiments of the disclosure provide a flexible printed circuit board and a display apparatus, which are configured to simplify the manufacturing process of the flexible printed circuit board and reduce the manufacturing cost of the flexible printed circuit board.

Figure 3:
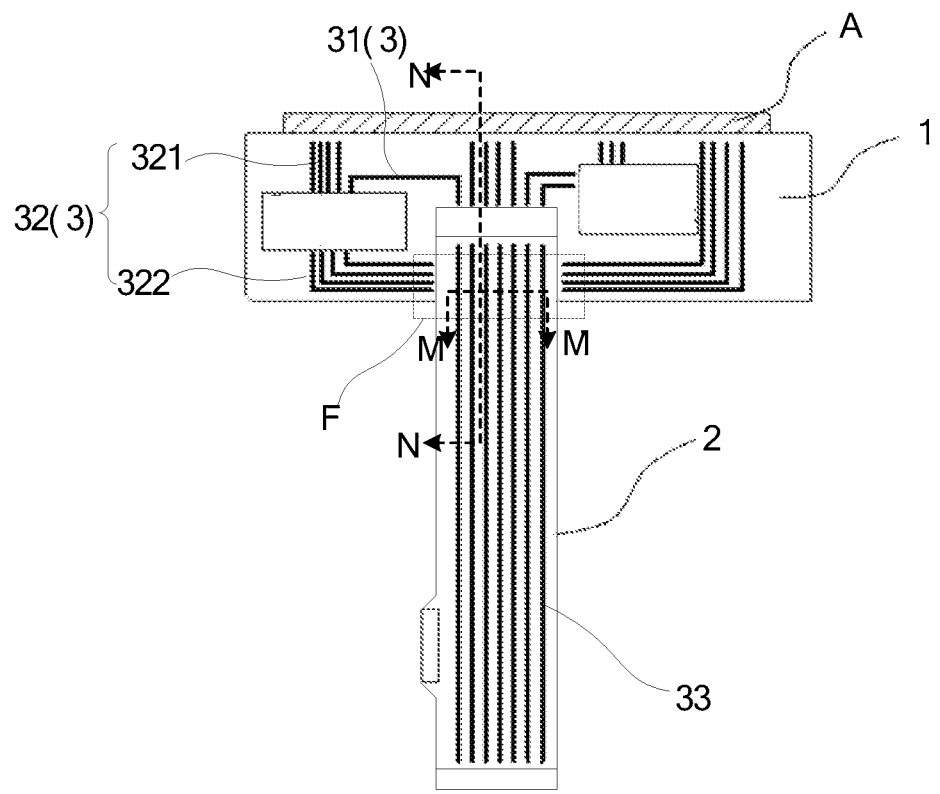
FIG. 3 is a schematic structural diagram of a flexible printed circuit board provided by an embodiment of the disclosure.
Figure 4:
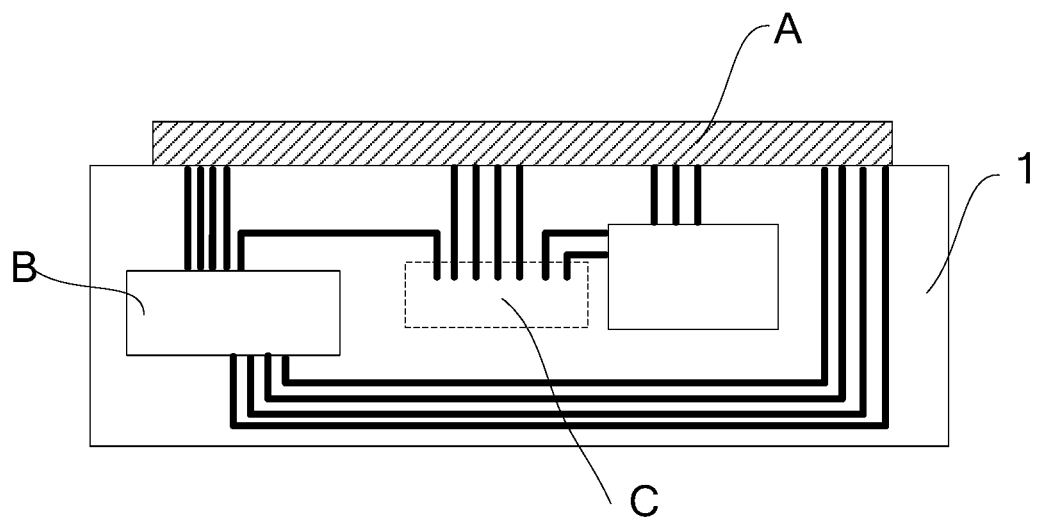
FIG. 4 is a schematic diagram showing region division of a main flexible printed circuit board in a flexible printed circuit board provided by an embodiment of the disclosure.
Figure 5:
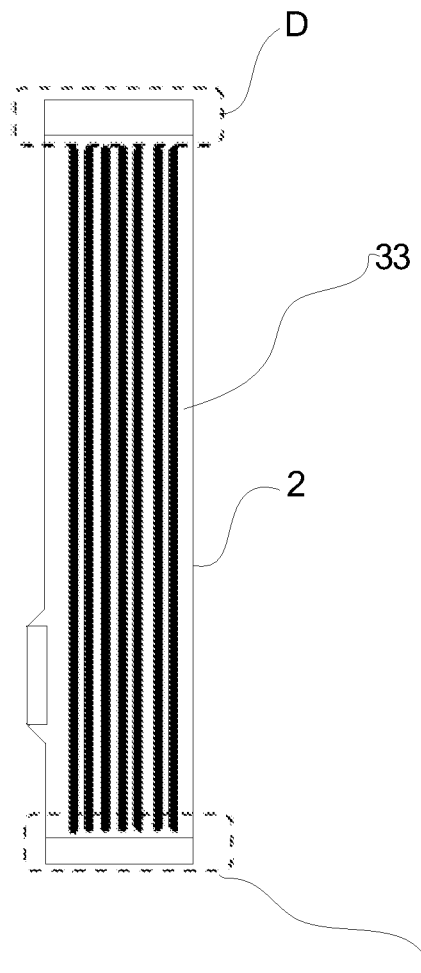
FIG. 5 is a schematic diagram showing region division of an adaptor flexible printed circuit board in a flexible printed circuit board provided by an embodiment of the disclosure.

In combination with FIG. 3 to FIG. 5, as shown in FIG. 3, which is a schematic structural diagram of a flexible printed circuit board provided by an embodiment of the disclosure, FIG. 4 is a schematic diagram of region division of a main flexible printed circuit board 1, FIG. 5 is a schematic diagram of region division of an adaptor flexible printed circuit board 2. In some embodiments, the flexible printed circuit board includes:

the main flexible printed circuit board 1 and the adaptor flexible printed circuit board 2 with an outline different from the main flexible printed circuit board 1, the main flexible printed circuit board 1 is a single-layer board or double-layer board, and the adaptor flexible printed circuit board 2 is a single-layer board or double-layer board;

the main flexible printed circuit board 1 includes a bonding region A configured for bonding with a display panel, a component arranging region B configured for arranging a control component, a first connection region C configured for connecting with the adaptor flexible printed circuit board 2, and a signal line 3, and the signal line 3 includes a first signal line 31 disposed between the component arranging region B and the first connection region C, and a second signal line 32 disposed between the bonding region A and the component arranging region B;

the adaptor flexible printed circuit board 2 includes a second connection region D configured for connecting with the main flexible printed circuit board 1, a third connection region E configured for connecting with a PCB, and a third signal line 33 disposed between the second connection region D and the third connection region E, and an orthographic projection of the second connection region D on the main flexible printed circuit board 1 completely falls within a region range of the main flexible printed circuit board 1, and an orthographic projection of the third connection region E on a plane of the main flexible printed circuit board 1 does not fall within the region range of the main flexible printed circuit board 1; and the main flexible printed circuit board 1 and the adaptor flexible printed circuit board 2 are connected through the first connection region C and the second connection region D, an orthographic projection of the third signal line 33 on the main flexible printed circuit board 1 has an overlapping region F with the second signal line, and in the overlapping region F, an electromagnetic shielding structure 4 is at least disposed at a side of the main flexible printed circuit board 1 facing the adaptor flexible printed circuit board 2 or at a side of the adaptor flexible printed circuit board 2 facing the main flexible printed circuit board 1.

In some embodiments, outlines of the main flexible printed circuit board 1 and the adaptor flexible printed circuit board 2 are different, the orthographic projection of the second connection region D on the main flexible printed circuit board 1 completely falls within the region range of the main flexible printed circuit board 1, the orthographic projection of the third connection region E on a plane of the main flexible printed circuit board 1 does not fall within the region range of the main flexible printed circuit board 1. As shown in FIG. 3, the main flexible printed circuit board 1 and the adaptor flexible printed circuit board 2 are rectangles of different sizes, a width of the outline of the main flexible printed circuit board 1 is greater than a width of the outline of the adaptor flexible printed circuit board 2, and a length of the outline of the adaptor flexible printed circuit board 2 is smaller than a length of the outline of the main flexible printed circuit board 1.

In the flexible printed circuit board, the main flexible printed circuit board 1 and the adaptor flexible printed circuit board 2 may be of the following four structures; a first structure with the main flexible printed circuit board 1 being a single-layer board and the adaptor flexible printed circuit board 2 being a single-layer board, a second setting structure with the main flexible printed circuit board 1 being a single-layer board and the adaptor flexible printed circuit board 2 being a double-layer board, a third setting structure with the main flexible printed circuit board 1 being a double-layer board and the adaptor flexible printed circuit board 2 being a single-layer board, and a fourth setting structure with the main flexible printed circuit board 1 being a double-layer board and the adaptor flexible printed circuit board 2 being a double-layer board. In practical applications. The flexible printed circuit boards with the same layout sizes, regardless of single-layer or double-layer, are simpler in manufacturing process and lower in manufacturing cost compared with the multilayer board.

In the embodiment of the disclosure, the main flexible printed circuit board 1 includes a bonding region A configured for bonding with a display panel, a component arranging region B configured for arranging a control component, a first connection region C configured for connecting with the adaptor flexible printed circuit board 2, and a signal line. The signal line includes a first signal line 31 disposed between the component arranging region B and the first connection region C, and a second signal line 32 disposed between the component arranging region B and the bonding region A. In some embodiments, the control component may be one or more. For example, the control component may be a touch driving chip, and a capacitor, a resistance and the like electrically connected with the touch driving chip, and the control component may further be a display driving chip, and a capacitor, a resistance and the like electrically connected with the display driving chip. As shown in FIG. 3, two component arranging regions B are set.

In some embodiments, the signal line may be a power line, a touch line, a display line and the like. The signal line includes the first signal line 31 disposed between the component arranging region B and the first connection region C, and a second signal line 32 disposed between the component arranging region B and the bonding region A. The first signal line 31 may be at least part of the power line, the touch line, the display line or the like, the second signal line 32 includes a first sub-line 321 and a second sub-line 322, for example, the first sub-line 321 may be an Rx line, and the second sub-line 322 may be a Tx line. In practical applications, those skilled in the art may set each line on the main flexible printed circuit board 1 according to the specific situation of the quantity of board layers of the main flexible printed circuit board 1, which will not be detailed here.

In the embodiment of the disclosure, the adaptor flexible printed circuit board 2 includes a second connection region D configured for connecting with the main flexible printed circuit board 1, a third connection region E configured for connecting with a PCB, and a third signal line 33 disposed between the second connection region D and the third connection region E. In some embodiments, the third signal line 33 may be the power line and the display line. In practical applications, those skilled in the art may set each line on the adaptor flexible printed circuit board 2 according to the specific situation of the quantity of board layers of the adaptor flexible printed circuit board 2, which will not be detailed here.

In the embodiment of the disclosure, the main flexible printed circuit board 1 and the adaptor flexible printed circuit board 2 are connected through the first connection region C and the second connection region D respectively, so that the main flexible printed circuit board 1 and the adaptor flexible printed circuit board 2 are lap-jointed together.

In the embodiment of the disclosure, in an overlapping region F of the second signal line 32 and the third signal line 33, an electromagnetic shielding structure 4 is at least disposed on one side of the main flexible printed circuit board 1 facing the adaptor flexible printed circuit board 2, or at one side of the adaptor flexible printed circuit board 2 facing the main flexible printed circuit board 1. In some embodiments, in the overlapping region F of the second signal line 32 and the third signal line 33, the electromagnetic shielding structure 4 may be set as follows: the electromagnetic shielding structure 4 is disposed on the side of the main flexible printed circuit board 1 facing the adaptor flexible printed circuit board 2, or the electromagnetic shielding structure 4 is disposed on the side of the adaptor flexible printed circuit board 2 facing the main flexible printed circuit board 1, or the electromagnetic shielding structure 4 is disposed on the side of the main flexible printed circuit board 1 facing the adaptor flexible printed circuit board 2 and the side of the adaptor flexible printed circuit board 2 facing the main flexible printed circuit board 1. In practical applications, the electromagnetic shielding structure 4 is set according to the board layer of the main flexible printed circuit board 1 and the adaptor flexible printed circuit board 2, and the specific settings will be detailed in the following contents. In addition, in some embodiments, the electromagnetic shielding structure 4 may be set according to the needs of the actual effect of shielding, which is not limited here.

In the embodiment of the disclosure, in the overlapping region F of the second signal line 32 and the third signal line 33, the electromagnetic shielding structure 4 is at least disposed on the side of the main flexible printed circuit board 1 facing the adaptor flexible printed circuit board 2 or on the side of the adaptor flexible printed circuit board 2 facing the main flexible printed circuit board 1, so as to ensure that there is no signal interference between the main flexible printed circuit board 1 and the adaptor flexible printed circuit board 2 which are lap-jointed. Since the main flexible printed circuit board 1 on the flexible printed circuit board may be manufactured by a single-layer board or a double-layer board, the adaptor flexible printed circuit board 2 may also be manufactured by the single-layer board or the double-layer board, the existing process may be adopted to manufacture, so that the manufacturing process of the flexible printed circuit board is simplified, and the manufacturing cost is reduced.

Figure 6:
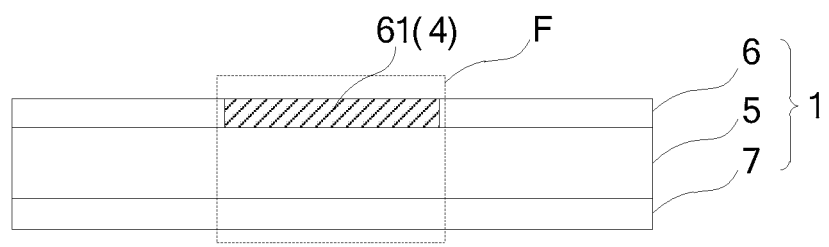
FIG. 6 is a schematic sectional view of the main flexible printed circuit board in the flexible printed circuit board along a direction indicated by MM' in FIG. 3 provided by an embodiment of the disclosure.
Figure 7:
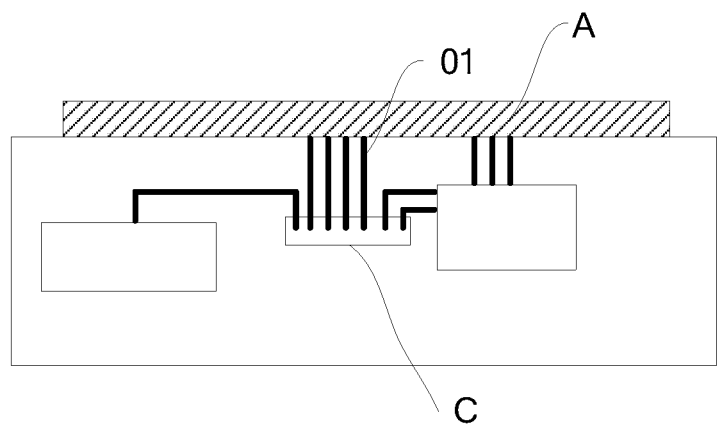
FIG. 7 is a schematic structural diagram of wiring of a first layer of the main flexible printed circuit board in FIG. 6.
Figure 8:
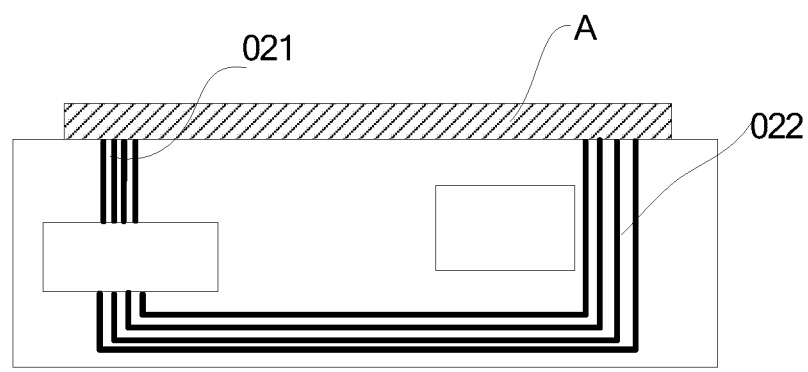
FIG. 8 is a schematic structural diagram of wiring of a second layer of the main flexible printed circuit board in FIG. 6.

In the embodiment of the disclosure, the main flexible printed circuit board 1 in the flexible printed circuit board may be the double-layer board, as shown in FIG. 6, which is a schematic sectional view of the main flexible printed circuit board 1 along the direction indicated by MM' in FIG. 3. Specifically, the main flexible printed circuit board 1 includes a first substrate layer 5, a first conductive layer 6 disposed on a first surface of the first substrate layer 5, and a second conductive layer 7 disposed on a second surface of the first substrate layer 5 opposite to the first surface. The first surface is one face of the first substrate layer 5 close to the adaptor flexible printed circuit board 2, the first conductive layer 6 includes the first signal line 31, and the second conductive layer 7 includes the second signal line 32. In the overlapping region F, the electromagnetic shielding structure 4 includes a first conductive part 61 disposed on the first conductive layer 6, the first conductive part 61 is insulated from the first signal line 31, and the first conductive part 61 is grounded. As shown in FIG. 7, which is a schematic structural diagram of wiring of a first layer of the main flexible printed circuit board 1 shown in FIG. 6, and FIG. 8 which is a schematic structural diagram of wiring of a second layer of the main flexible printed circuit board 1 shown in FIG. 6.

Figure 9:
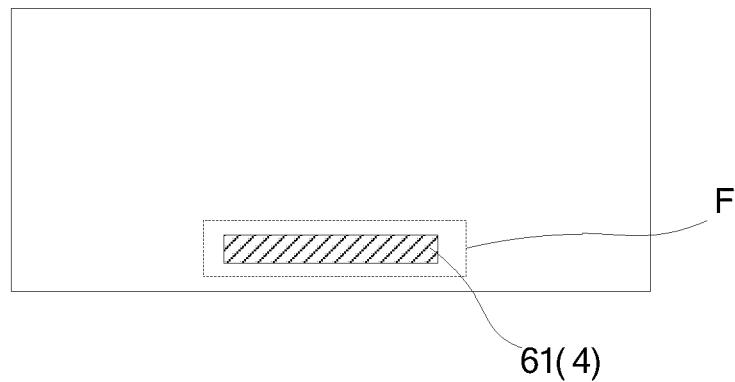
FIG. 9 is a schematic top view of a first surface of the main flexible printed circuit board in FIG. 6.

In some embodiments, materials of the first conductive layer 6 and the second conductive layer 7 are generally copper foils, the copper foils are etched according to the layout of the lines, one part of the copper foils forms the required signal lines, and the other part is grounded. In the overlapping region F, the electromagnetic shielding structure 4 includes the first conductive part 61 in the first conductive layer 6, the first conductive part 61 is insulated from the first signal line 31, and the first conductive part 61 is grounded. In some embodiments, in the overlapping region F, the first conductive part 61 is grounded, thereby realizing the shielding between the first signal line 31 and the second signal line 32 in the overlapping region F, and thus the performance of the flexible printed circuit board is improved. As shown in FIG. 9, which is a schematic top view of a first surface of the main flexible printed circuit board 1 in FIG. 6, a region indicated by a dotted line frame is the overlapping region F, and the first conductive part 61 is positioned in the overlapping region F. In some embodiments, since the main flexible printed circuit board 1 is the double-layer board, the existing process may be adopted to manufacture, and correspondingly, the manufacturing process is relatively simple.

Figure 10:
FIG. 10 is a schematic sectional view of the adaptor flexible printed circuit board in the flexible printed circuit board along the direction indicated by MM' in FIG. 3 provided by an embodiment of the disclosure.

In the embodiment of the disclosure, the adaptor flexible printed circuit board 2 in the flexible printed circuit board may be a single-layer board, as shown in FIG. 10, which is a schematic sectional view of the adaptor flexible printed circuit board 2 along the direction indicated by MM' in FIG. 3. In some embodiments, the adaptor flexible printed circuit board 2 includes a second substrate layer 8, and a third conductive layer 9 disposed on a third surface of the second substrate layer 8. The third surface is one face of the second substrate layer 8 facing away from the main flexible printed circuit board 1, the third conductive layer 9 includes a third signal line 33, and the third signal line 33 is electrically connected with the first signal line 31 through a via hole running through the third conductive layer 9 and the second substrate layer 8.

In some embodiments, a material of the third conductive layer 9 is generally a copper foil, the copper foil is etched according to the layout of the lines, so as to form the third signal line 33. In some embodiments, when the adaptor flexible printed circuit board 2 is the single-layer board as shown in FIG. 10, and the main flexible printed circuit board 1 is the double-layer board as shown in FIG. 6, the electromagnetic shielding structure 4 may be the first conductive part 61 disposed on the main flexible printed circuit board 1, the third signal line 33 is electrically connected with the first signal line 31 through the via hole running through the third conductive layer 9 and the second substrate layer 8, thereby realizing the electric connection between the main flexible printed circuit board 1 and the adaptor flexible printed circuit board 2. In some embodiments, the adaptor flexible printed circuit board 2 is the single-layer board, the existing process may be adopted to manufacture, and correspondingly, the manufacturing process is relatively simple.

Figure 11:
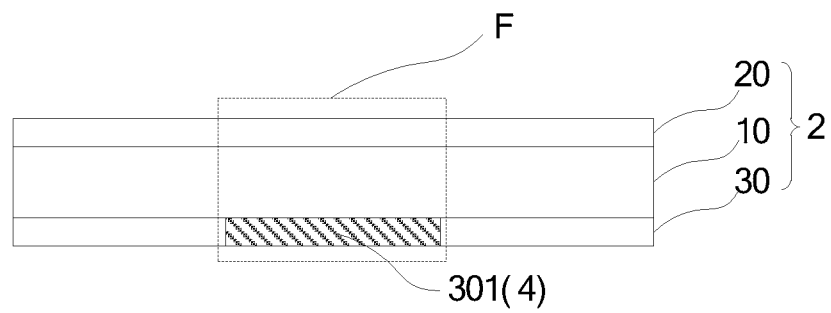
FIG. 11 is a schematic sectional view of the adaptor flexible printed circuit board in the flexible printed circuit board along the direction indicated by MM' in FIG. 3 provided by an embodiment of the disclosure.

In the embodiment of the disclosure, the adaptor flexible printed circuit board 2 in the flexible printed circuit board may be the double-layer board, as shown in FIG. 11, which is a schematic sectional view of the adaptor flexible printed circuit board 2 along the direction indicated by MM' in FIG. 3. In some embodiments, the adaptor flexible printed circuit board 2 includes a third substrate layer 10, a fourth conductive layer 20 disposed on a fourth surface of the third substrate layer 10, and a fifth conductive layer 30 disposed on a fifth surface of the third substrate layer 10 opposite to the fourth surface. The fifth surface is one face of the third substrate layer 10 close to the main flexible printed circuit board 1, and the fourth conductive layer 20 includes the third signal line 33; and in the overlapping region F, the electromagnetic shielding structure 4 includes a second conductive part 301 in the fifth conductive layer 30, and the second conductive part 301 is grounded.

In some embodiments, materials of the fourth conductive layer 20 and the fifth conductive layer 30 are generally copper foils, the copper foils are etched according to the layout of the lines, one part of the copper foils forms the required signal lines, and the other part may be grounded according to the needs. In the overlapping region F, the electromagnetic shielding structure 4 includes the second conductive part 301 in the fifth conductive layer 30, and the second conductive part 301 is grounded. In some embodiments, in the overlapping region F, the second conductive part 301 is grounded, thereby realizing the shielding between the first signal line 31 and the second signal line 32 in the overlapping region F, and thus the performance of the flexible printed circuit board is improved. In some embodiments, since the main flexible printed circuit board 1 is the double-layer board, the existing process may be adopted to manufacture, and correspondingly, the manufacturing process is relatively simple.

In some embodiments, when the adaptor flexible printed circuit board 2 is the double-layer board as shown in FIG. 11, and the main flexible printed circuit board 1 is the single-layer board as shown in FIG. 6, the electromagnetic shielding structure 4 may include the first conductive part 61 in the main flexible printed circuit board 1, and the second conductive part 301 in the adaptor flexible printed circuit board 2, the first conductive part 61 and the second conductive part 301 are grounded, thereby realizing the shielding between the first signal line 31 and the second signal line 32 in the overlapping region F. Since there are two layers of grounded conductive parts between the first signal line 31 and the second signal line 32, the shielding between the first signal line 31 and the second signal line 32 is improved, and thus the performance of the flexible printed circuit board is improved. In addition, in some embodiments, when the adaptor flexible printed circuit board 2 is the double-layer board as shown in FIG. 11, and the main flexible printed circuit board 1 is the double-layer board as shown in FIG. 6, the third signal line 33 is electrically connected with the first signal line 31 through a via hole running through the fifth conductive layer 30 and the third substrate layer 10, thereby realizing the electric connection between the main flexible printed circuit board 1 and the adaptor flexible printed circuit board 2. In some embodiments, the adaptor flexible printed circuit board 2 is the double-layer board, the existing process may be adopted to manufacture, and correspondingly, the manufacturing process is relatively simple.

Figure 12:
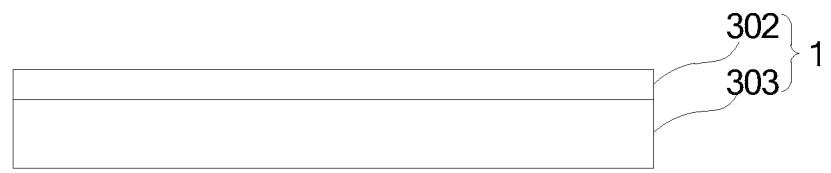
FIG. 12 is a schematic sectional view of the main flexible printed circuit board in the flexible printed circuit board along the direction indicated by MM' in FIG. 3 provided by an embodiment of the disclosure.

In the embodiment of the disclosure, the main flexible printed circuit board 1 in the flexible printed circuit board may be the single-layer board, as shown in FIG. 12, which is a schematic sectional view of the main flexible printed circuit board 1 along the direction indicated by MM' in FIG. 3. In some embodiments, the main flexible printed circuit board 1 includes a fourth substrate layer 302, and a sixth conductive layer 303 disposed on a fourth surface of the fourth substrate layer 302. The fourth surface is one face of the fourth substrate layer 302 facing away from the adaptor flexible printed circuit board 2, and the sixth conductive layer 303 includes the first signal line 31 and the second signal line 32. In some embodiments, a material of the sixth conductive layer 303 is generally a copper foil, the copper foil is etched according to the layout of the lines, so as to form the first signal line 31 and the second signal line 32.

In some embodiments, when the adaptor flexible printed circuit board 2 is the single-layer board as shown in FIG. 10, and the main flexible printed circuit board 1 is the single-layer board as shown in FIG. 12, the electromagnetic shielding structure 4 may be disposed at one side of the fourth substrate layer 302 close to the adaptor flexible printed circuit board 2, and the electromagnetic shielding structure 4 may further be disposed at one side of the second substrate layer 8 close to the main flexible printed circuit board 1. When the main flexible printed circuit board 1 and the adaptor flexible printed circuit board 2 in the flexible printed circuit board are both the single-layer boards, the manufacturing process of the flexible printed circuit board is simplified, and meanwhile, the lightweight design of the flexible printed circuit board is realized.

In some embodiments, when the adaptor flexible printed circuit board 2 is the double-layer board as shown in FIG. 11, and the main flexible printed circuit board 1 is the single-layer board as shown in FIG. 12, the electromagnetic shielding structure 4 may be disposed at the side of the fourth substrate layer 302 close to the adaptor flexible printed circuit board 2, and the electromagnetic shielding structure 4 may further be disposed in the fifth conductive layer 30, such as the second conductive part 301.

Figure 13:
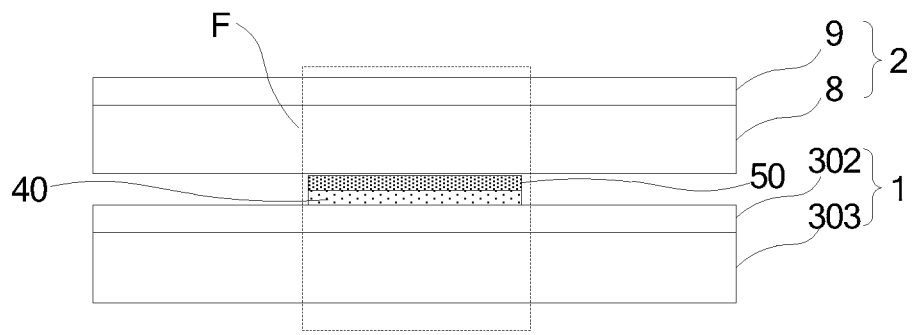
FIG. 13 is a schematic sectional view of the flexible printed circuit board along the direction indicated by MM' in FIG. 3 provided by an embodiment of the disclosure.
Figure 14:
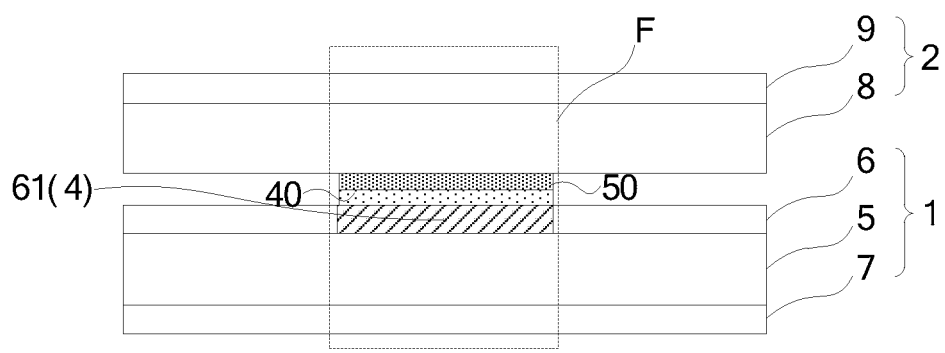
FIG. 14 is a schematic structural diagram of the flexible printed circuit board along the direction indicated by MM' in FIG. 3 provided by an embodiment of the disclosure.

In the embodiment of the disclosure, in combination with FIG. 13 and FIG. 14, in the overlapping region F, the electromagnetic shielding structure 4 includes a first electromagnetic shielding layer 40 disposed on the side of the main flexible printed circuit board 1 facing the adaptor flexible printed circuit board 2, and/or a second electromagnetic shielding layer 50 disposed on the side of the adaptor flexible printed circuit board 2 facing the main flexible printed circuit board 1. In a specific embodiment, in the overlapping region F, based on the flexible printed circuit board shown in FIG. 3, whether the main flexible printed circuit board 1 is the single-layer board or the double-layer board, and the adaptor flexible printed circuit board 2 is the single-layer board or the double-layer board, the first electromagnetic shielding layer 40 may be directly disposed on the side of the main flexible printed circuit board 1 facing the adaptor flexible printed circuit board 2, or the second electromagnetic shielding layer 50 may be directly disposed on the side of the adaptor flexible printed circuit board 2 facing the main flexible printed circuit board 1; or the first electromagnetic shielding layer 40 may be directly disposed on the side of the main flexible printed circuit board 1 facing the adaptor flexible printed circuit board 2, and the second electromagnetic shielding layer 50 may be directly disposed on the side of the adaptor flexible printed circuit board 2 facing the main flexible printed circuit board 1, thereby improving a shielding effect between the second signal line 32 and the third signal line 33 in the overlapping region F, and thus the use performance of the flexible printed circuit board is improved. In addition, since the first electromagnetic shielding layer 40 and the second electromagnetic shielding layer 50 may be directly attached to corresponding positions according to the needs, the whole manufacturing process is relatively simple, and the manufacturing cost is low.

In some embodiments, when the main flexible printed circuit board 1 is the double-layer board shown in FIG. 6, in the overlapping region F, the first electromagnetic shielding layer 40 may be disposed on the side of the main flexible printed circuit board 1 facing the adaptor flexible printed circuit board 2, specifically may be disposed on one side of the first conductive part 61 facing the adaptor flexible printed circuit board 2. Since the first conductive part 61 and the first electromagnetic shielding layer 40 are disposed on the side of the main flexible printed circuit board 1 facing the adaptor flexible printed circuit board 2 at the same time, the shielding effect between the third signal line 33 and the second signal line 32 in the overlapping region F is improved, and thus the use performance of the flexible printed circuit board is improved.

In some embodiments, when the adaptor flexible printed circuit board 2 is the single-layer board shown in FIG. 10, in the overlapping region F, the second electromagnetic shielding layer 50 may be disposed on the side of the adaptor flexible printed circuit board 2 facing the main flexible printed circuit board 1, since the second electromagnetic shielding layer 50 is disposed on the side of the adaptor flexible printed circuit board 2 facing the main flexible printed circuit board 1, the shielding between the third signal line 33 and the second signal line 32 in the overlapping region F is ensured, and thus the use performance of the flexible printed circuit board is improved.

In addition, when the main flexible printed circuit board 1 is the double-layer board shown in FIG. 6, and the adaptor flexible printed circuit board 2 is the single-layer board shown in FIG. 10, if the first electromagnetic shielding layer 40 is disposed on the side of the first conductive part 61 facing the adaptor flexible printed circuit board 2, and the second electromagnetic shielding layer 50 is disposed on the side of the adaptor flexible printed circuit board 2 facing the main flexible printed circuit board 1 at the same time, the shielding effect between the third signal line 33 and the second signal line 32 is enhanced under the shielding action of the first conductive part 61, the first electromagnetic shielding layer 40 and the second electromagnetic shielding layer 50, and the performance of the flexible printed circuit board is improved.

In some embodiments, when the adaptor flexible printed circuit board is the double-layer board shown in FIG. 11, in the overlapping region F, the second electromagnetic shielding layer 50 may be disposed on the side of the adaptor flexible printed circuit board 2 facing the main flexible printed circuit board 1, specifically may be disposed on one side of the second conductive part 301 facing the main flexible printed circuit board 1, thereby ensuring the shielding between the third signal line 33 and the second signal line 32 in the overlapping region F, and thus the use performance of the flexible printed circuit board is improved.

In addition, when the main flexible printed circuit board 1 is the double-layer board shown in FIG. 6, and the adaptor flexible printed circuit board 2 is the double-layer board shown in FIG. 11, if the first electromagnetic shielding layer 40 is disposed on the side of the first conductive part 61 facing the adaptor flexible printed circuit board 2, and the second electromagnetic shielding layer 50 is disposed on the side of the second conductive part 301 facing the main flexible printed circuit board 1 at the same time, the shielding effect between the third signal line 33 and the second signal line 32 is enhanced under the shielding action of the first conductive part 61, the first electromagnetic shielding layer 40, the second conductive part 301 and the second electromagnetic shielding layer 50, and the performance of the flexible printed circuit board is improved.

In the embodiment of the disclosure, for a specific example, when the main flexible printed circuit board 1 in the flexible printed circuit board is the single-layer board shown in FIG. 12, and the adaptor flexible printed circuit board 2 is the single-layer board shown in FIG. 10, as shown in FIG. 13, which is a schematic sectional view in the direction shown by MM' in FIG. 3. In some embodiments, the first electromagnetic shielding layer 40 is disposed at one side of the fourth substrate layer 302 of the main flexible printed circuit board 1 facing the adaptor flexible printed circuit board 2, and the second electromagnetic shielding layer 50 is disposed at one side of the second substrate layer 8 of the adaptor flexible printed circuit board 2 close to the main flexible printed circuit board 1. Of course, those skilled in the art may further set the positions of the first electromagnetic shielding layer 40 and the second electromagnetic shielding layer 50 according to the actual needs, which will not be detailed here.

In the embodiment of the disclosure, for a specific example, when the main flexible printed circuit board 1 in the flexible printed circuit board is the double-layer board shown in FIG. 6, and the adaptor flexible printed circuit board 2 is the single-layer board shown in FIG. 10, as shown in FIG. 14, which is a schematic sectional view in the direction shown by MM' in FIG. 3. In some embodiments, the grounded first conductive part 61 is disposed in the first conductive layer 6 of the main flexible printed circuit board 1, the first electromagnetic shielding layer 40 is disposed at one side of the first conductive part 61 close to the adaptor flexible printed circuit board 2, and the second electromagnetic shielding layer 50 is disposed at the side of the second substrate layer 8 of the adaptor flexible printed circuit board 2 close to the main flexible printed circuit board 1. Of course, those skilled in the art further set the positions of the first electromagnetic shielding layer 40 and the second electromagnetic shielding layer 50 according to the actual needs, which will not be detailed here.

Figure 15:
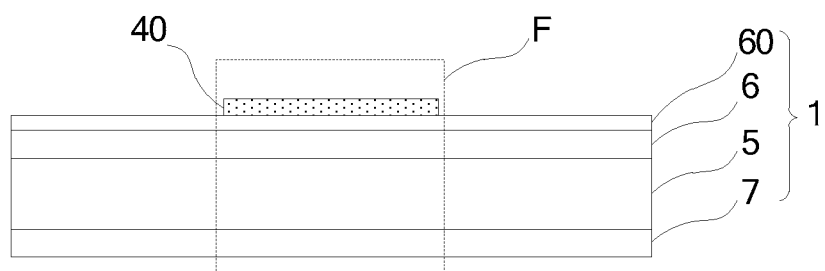
FIG. 15 is a schematic sectional view of the main flexible printed circuit board in the flexible printed circuit board along the direction indicated by MM' in FIG. 3 provided by an embodiment of the disclosure.

In the embodiment of the disclosure, a first covering film 60 is disposed at the side of the main flexible printed circuit board 1 facing the adaptor flexible printed circuit board 2, and the first electromagnetic shielding layer 40 is disposed on one side of the first covering film 60 close to the adaptor flexible printed circuit board 2. The first covering film 60 can ensure that the first conductive layer 6 is not exposed to the air, which avoids the oxidation of the first conductive layer 6, and thus the performance of the flexible printed circuit board is improved. As shown in FIG. 15, which is a schematic sectional view of the main flexible printed circuit board 1 in the flexible printed circuit board along the direction indicated by MM' in FIG. 3 of the embodiment of the disclosure.

Of course, in practical applications, in addition to the above setting modes of the electromagnetic shielding structure 4, those skilled in the art may further set the electromagnetic shielding structure 4 according to the actual needs, which will not be detailed here.

In the embodiment of the disclosure, the first electromagnetic shielding layer 40 is one or more of conductive rubber, conductive cloth, conductive foam or conductive shielding glue, and the second electromagnetic shielding layer 50 is one or more of the conductive rubber, the conductive cloth, the conductive foam or the conductive shielding glue. While the first electromagnetic shielding layer 40 and the second electromagnetic shielding layer 50 effectively shield the third signal line 33 and the second signal line 32, the whole manufacturing process is relatively simple.

In the embodiment of the disclosure, the main flexible printed circuit board 1 and the adaptor flexible printed circuit board 2 are connected together in the first connection region C and the second connection region D respectively through a board-to-board (BTB) connector, a zero-insertion-force (ZIF) connector and FOF bonding, so that the effective electric connection between the main flexible printed circuit board 1 and the adaptor flexible printed circuit board 2 is ensured, and the connection flexibility between the two can be ensured. In addition, in some embodiments, a contact pad connection mode of soldering tin may further be used to realize the connection between the main flexible printed circuit board 1 and the adaptor flexible printed circuit board 2 in the first connection region C and the second connection region D respectively. Of course, in addition, other types of connectors may be selected according to the actual needs to realize the electric connection between the main flexible printed circuit board 1 and the adaptor flexible printed circuit board 2 in the first connection region C and the second connection region D, which is not limited here.

Figure 16:
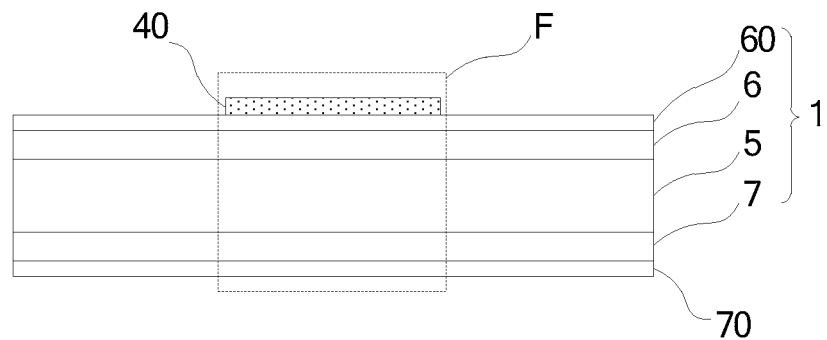
FIG. 16 is a schematic sectional view of the main flexible printed circuit board in the flexible printed circuit board along the direction indicated by MM' in FIG. 3 provided by an embodiment of the disclosure.

In the embodiment of the disclosure, a second covering film 70 is disposed on one side of the second conductive layer 7 facing away from the first substrate layer 5. The second covering film 70 can avoid the second conductive layer 7 from being exposed to the air, which avoids the oxidation of the second conductive layer 7, and thus the performance of the flexible printed circuit board is improved. As shown in FIG. 16, which is a schematic structural diagram of the main flexible printed circuit board 1 in the flexible printed circuit board along the direction indicated by MM' in FIG. 3 of the embodiment of the disclosure.

Figure 17:
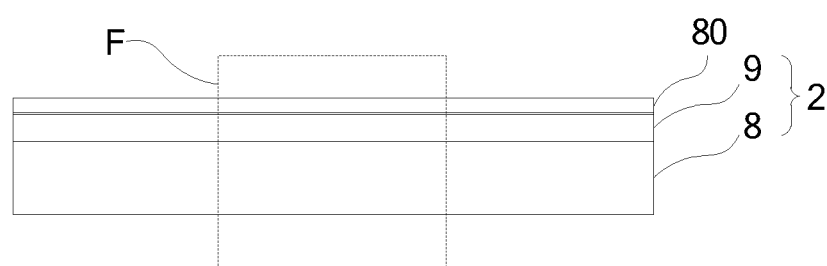
FIG. 17 is a schematic sectional view of the adaptor flexible printed circuit board in the flexible printed circuit board along the direction indicated by MM' in FIG. 3 provided by an embodiment of the disclosure.

In the embodiment of the disclosure, a third covering film 80 is disposed on one side of the third conductive layer 9 facing away from the second substrate layer 8. The third covering film 80 can avoid the third conductive layer 9 from being exposed to the air, which avoids the oxidation of the third conductive layer 9, and thus the performance of the flexible printed circuit board is improved. In FIG. 17, a schematic structural diagram of the adaptor flexible printed circuit board 2 in the flexible printed circuit board along the direction indicated by MM' in FIG. 3 of the embodiment of the disclosure is shown.

Figure 18:
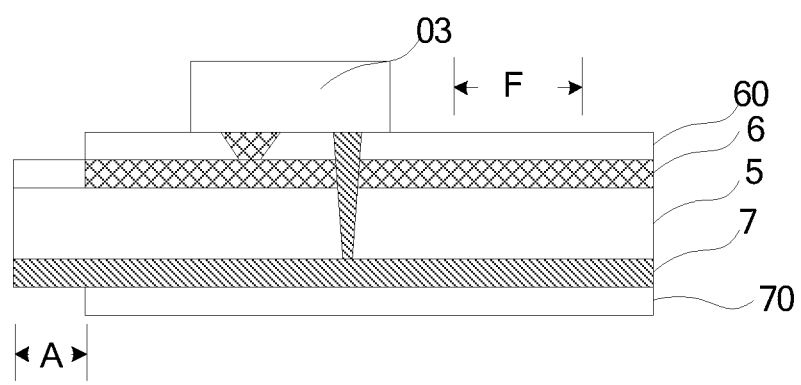
FIG. 18 is a schematic sectional view of the main flexible printed circuit board in the flexible printed circuit board along the direction indicated by NN' in FIG. 3 provided by an embodiment of the disclosure.

In some embodiments, taking a display panel as an example, as shown in FIG. 18, which is a schematic sectional view of the main flexible printed circuit board 1 along the direction indicated by NN' in FIG. 3, a line positioned in the bonding region A may be led out from the second conductive layer 7 of the main flexible printed circuit board 1. In this case, the power line and the display line positioned on the main flexible printed circuit board 1 extend to the first conductive layer 6 through a via hole before being connected with the adaptor flexible printed circuit board 2, the Tx line and the Rx line related to a touch function are connected with a touch driving component 03 on the first conductive layer 6, and except for the Tx line, the Rx line, the power line and the display line, the rest of the lines may be in the first conductive layer 6 or the second conductive layer 7. In the overlapping region F, the Tx line and the Rx line on the main flexible printed circuit board 1 are in the second conductive layer 7, thereby ensuring that the flexible printed circuit board has a good shielding effect, and thus the use performance of the flexible printed circuit board is improved.

Figure 19:
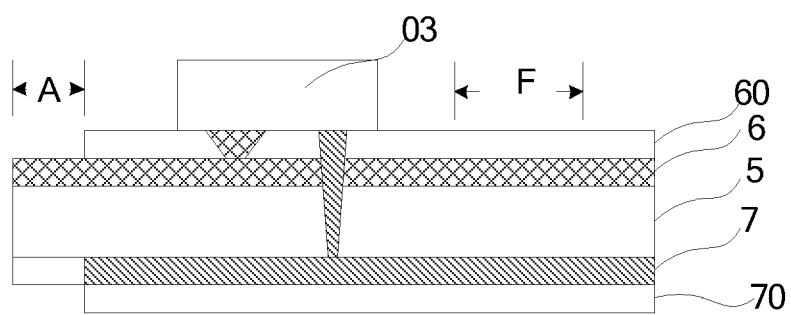
FIG. 19 is a schematic sectional view of the main flexible printed circuit board in the flexible printed circuit board along the direction indicated by NN' in FIG. 3 provided by an embodiment of the disclosure.

In addition, in some embodiments, as shown in FIG. 19, which is a schematic sectional view of the main flexible printed circuit board 1 along the direction indicated by NN' in FIG. 3, a line positioned in the bonding region A may also be led out from the first conductive layer 6 of the main flexible printed circuit board 1, and the introduction of the relevant film layers is the same as above, which will not be detailed here.

In the embodiment of the disclosure, thicknesses of the first substrate layer 5, the second substrate layer 8, the third substrate layer 10, the first conductive layer 6, the second conductive layer 7, the third conductive layer 9, the fourth conductive layer 20, the fifth conductive layer 30, the first covering film 60, the second covering film 70 and the third covering film 80 are not specifically limited.

In some embodiments, the above flexible printed circuit board provided by the embodiment of the disclosure further includes other film layers, such as a glue layer, a reinforcement layer, etc., which are the same as those in the related art, and will not be detailed here.

Figure 20:
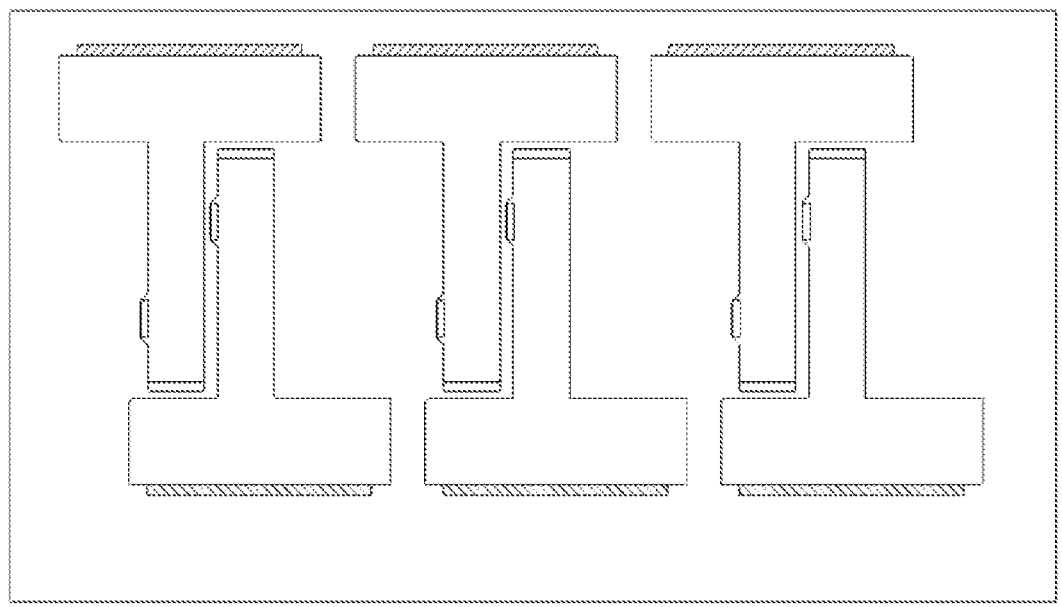
FIG. 20 is a schematic diagram of the layout of the flexible printed circuit board shown in FIG. 1.
Figure 21:
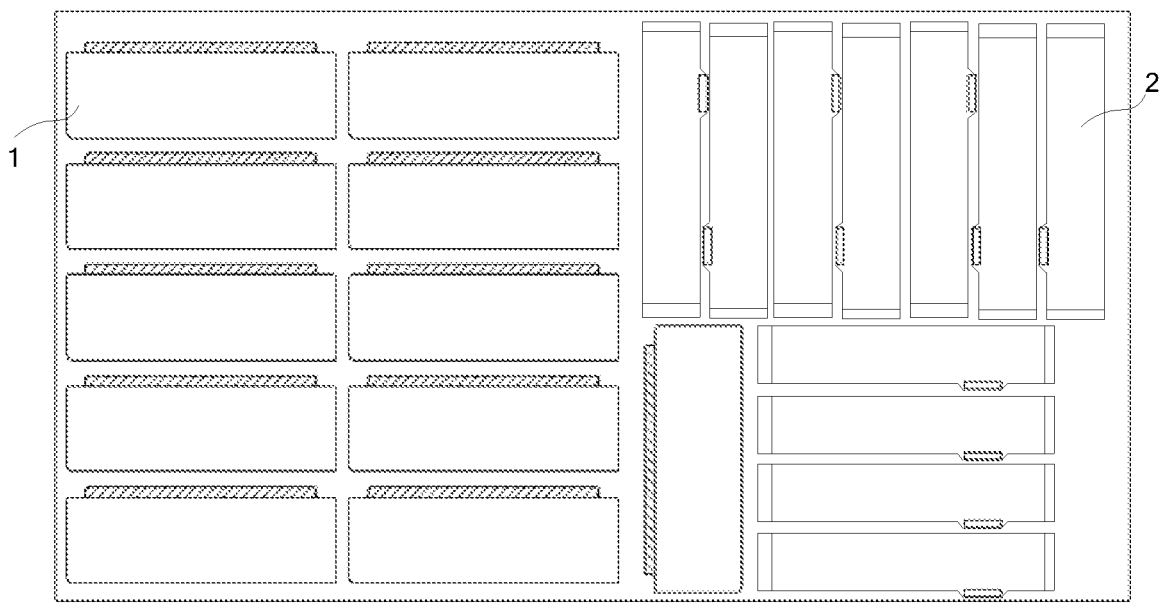
FIG. 21 is a schematic diagram of the layout of the flexible printed circuit board provided by an embodiment of the disclosure.

In the embodiment of the disclosure, for the flexible printed circuit board of the multilayer boards, especially for a special-shaped structure such as that shown in FIG. 1, in the related art, a plurality of flexible printed circuit boards shown in FIG. 1 are usually laid on a single layout, and then cut into required flexible printed circuit boards. Taking the layout shown in FIG. 20 as an example, only six flexible printed circuit boards shown in FIG. 1 can be arranged on the same layout. If the layout of the same size is adopted to manufacture the main flexible printed circuit board 1 and the adaptor flexible printed circuit board 2 in the embodiment of the disclosure, the main flexible printed circuit board 1 and the adaptor flexible printed circuit board 2 may be manufactured separately, and then the two are connected together to form a special-shaped flexible printed circuit board. When the layout of the same size as that is FIG. 20 is adopted, the schematic layout diagram of the flexible printed circuit board provided by the embodiment of the disclosure is as shown in FIG. 21, as an example, eleven main flexible printed circuit boards 1 and eleven adaptor flexible printed circuit boards 2 can be arranged on the layout respectively, and eleven flexible printed circuit boards can be manufactured after cutting. It can be seen that the manufacturing efficiency of the flexible printed circuit board in the embodiment of the disclosure is higher.

Figure 22:
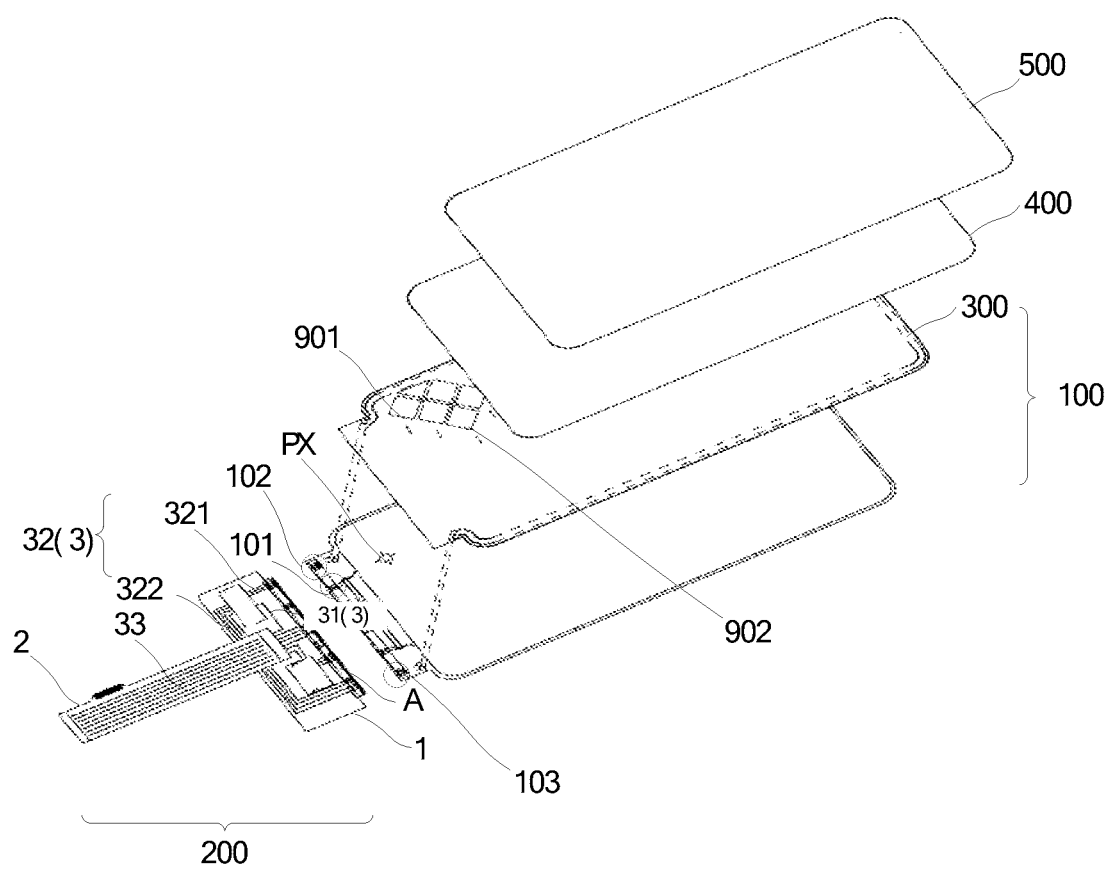
FIG. 22 is a schematic structural diagram of a display apparatus provided by an embodiment of the disclosure.

Based on the same inventive concept, an embodiment of the disclosure further provides a display apparatus, as shown in FIG. 22, which is a schematic decomposition diagram of the display apparatus, specifically, the display apparatus includes: a display panel 100, and a flexible printed circuit board 200 electrically connected with the display panel 100.

The flexible printed circuit board 200 includes: a main flexible printed circuit board 1 and an adaptor flexible printed circuit board 2 with an outline different from the main flexible printed circuit board 1, the main flexible printed circuit board 1 is a single-layer board or double-layer board, and the adaptor flexible printed circuit board 2 is a single-layer board or double-layer board.

The main flexible printed circuit board 1 includes a bonding region A configured for bonding with the display panel 100, a component arranging region B configured for arranging a control component, a first connection region C configured for connecting with the adaptor flexible printed circuit board 2, and a signal line 3, and the signal line 3 includes a first signal line 31 disposed between the component arranging region B and the first connection region C, and a second signal line 32 disposed between the bonding region A and the component arranging region B.

The adaptor flexible printed circuit board 2 includes a second connection region D configured for connecting with the main flexible printed circuit board 1, a third connection region E configured for connecting with a PCB, and a third signal line 33 disposed between the second connection region D and the third connection region E. An orthographic projection of the second connection region D on the main flexible printed circuit board 1 completely falls within a region range of the main flexible printed circuit board 1, and an orthographic projection of the third connection region E on a plane of the main flexible printed circuit board 1 does not fall within the region range of the main flexible printed circuit board 1.

The main flexible printed circuit board 1 and the adaptor flexible printed circuit board 2 are connected together through the first connection region C and the second connection region D, and an orthographic projection of the third signal line 33 on the main flexible printed circuit board 1 overlaps with the second signal line; and in an overlapping region F of the second signal line 32 and the third signal line 33, an electromagnetic shielding structure 4 is at least disposed at one side of the main flexible printed circuit board 1 facing the adaptor flexible printed circuit board 2 or at one side of the adaptor flexible printed circuit board 2 facing the main flexible printed circuit board 1.

In some embodiments, the display panel 100 includes: pixel units PX arranged in an array, and a first functional line 101 electrically connected with the pixel units PX. The first functional line 101 is electrically connected with the third signal line 33 on the flexible printed circuit board 200 through the bonding region A, and the first functional line 101 is configured to receive a display signal from the flexible printed circuit board 200.

The display panel 100 further includes a touch layer 300, the touch layer 300 is disposed at one sides of the pixel units PX away from a base substrate, and has a plurality of first touch electrodes 901 and a plurality of second touch electrodes 902. A second functional line 102 is electrically connected with the first touch electrodes 901, a third functional line 103 is electrically connected with the second touch electrodes 902, the second functional line 102 is electrically connected with a first sub-line 321 in the second signal line 32 on the flexible printed circuit board 200 through the bonding region A, the third functional line 103 is electrically connected with a second sub-line 322 in the second signal line 32 on the flexible printed circuit board 200 through the bonding region A, and the second functional line 102 and the third functional line 103 are configured to receive or send a touch signal.

In some embodiments, the first sub-line 321 may be an Rx line on the flexible printed circuit board 200, and the second sub-line 322 may be a Tx line on the flexible printed circuit board 200. The first functional line 101 may be a Data line, a VDD line or a VSS line, which is not limited here. The second functional line 102 may be an Rx line on the display panel 100, and the third functional line 103 may be a Tx line on the display panel 100.

In some embodiments, the first touch electrodes 901 and the second touch electrodes 902 are disposed in the same layer, correspondingly forming a self-capacitive touch, and the first touch electrodes 901 and the second touch electrodes 902 may be self-capacitive electrodes. Mutual capacitive electrodes may be selected according to the actual needs, and the specific settings are the same as those of the related art, which will not be detailed here.

In some embodiments, the display apparatus further includes a functional module layer 400 and a cover plate 500 which are disposed at one side of the touch layer 300 facing away from the base substrate. The functional module layer 400, may be a polarizer, of course, may be set to include other film layers according to the actual needs, which will not be detailed here.

In some embodiments, the principle for solving problems of the display apparatus is similar to that of the above flexible printed circuit board 200, therefore, the implementation of the display apparatus may refer to the implementation of the above flexible printed circuit board 200, and repetition will not be made.

In some embodiments, the flexible printed circuit board 200 may be bent to a back of the display panel, so as to realize a narrow bezel design of the display apparatus. The display apparatus provided by the embodiment of the disclosure may be a mobile phone, a tablet computer, a television, a display, a laptop, a digital photo frame, a navigator and any product or component with a display function. Other essential components of the display apparatus shall be understood by those of ordinary skill in the art, and is omitted herein and also shall not become a restriction to the disclosure.

Although the preferred embodiments of the disclosure have been described, those skilled in the art can make additional changes and modifications on these embodiments once they know the basic creative concept. So the appended claims are intended to be construed to include the preferred embodiments and all changes and modifications that fall into the scope of the disclosure.

Obviously, those skilled in the art can make various modifications and variations to the disclosure without departing from the spirit and scope of the disclosure. In this way, if these modifications and variations of the disclosure fall within the scope of the claims of the disclosure and equivalent technologies thereof, the disclosure is also intended to include these modifications and variations.

What is claimed is:

1. A flexible printed circuit board, comprising a main flexible printed circuit board and an adaptor flexible printed circuit board; wherein
   the main flexible printed circuit board is a single-layer board or a double-layer board, and comprises:
      a bonding region configured for bonding with a display panel;
      a component arranging region configured for arranging a control component;
      a first connection region configured for connecting with the adaptor flexible printed circuit board;
      a first signal line disposed between the component arranging region and the first connection region; and
      a second signal line disposed between the component arranging region and the bonding region;
   the adaptor flexible printed circuit board has an outline different from an outline of the main flexible printed circuit board, the adaptor flexible printed circuit board is a single-layer board or a double-layer board, and the adaptor flexible printed circuit board comprises:
      a second connection region configured for connecting with the main flexible printed circuit board;
      a third connection region configured for connecting with a printed circuit board; and
      a third signal line disposed between the second connection region and the third connection region;
      wherein an orthographic projection of the second connection region on the main flexible printed circuit board completely falls within a region range of the main flexible printed circuit board, and an orthographic projection of the third connection region on a plane of the main flexible printed circuit board does not fall within the region range of the main flexible printed circuit board;
   the main flexible printed circuit board and the adaptor flexible printed circuit board are connected through the first connection region and the second connection region, an orthographic projection of the third signal line on the main flexible printed circuit board and the second signal line have an overlapping region; wherein
      in the overlapping region, an electromagnetic shielding structure is at least disposed on a side of the main flexible printed circuit board facing the adaptor flexible printed circuit board or on a side of the adaptor flexible printed circuit board facing the main flexible printed circuit board;
   wherein the adaptor flexible printed circuit board comprises a third substrate layer, a fourth conductive layer disposed on a fourth surface of the third substrate layer, and a fifth conductive layer disposed on a fifth surface of the third substrate layer opposite to the fourth surface, wherein the fifth surface is a surface of the third substrate layer close to the main flexible printed circuit board, and the fourth conductive layer comprises the third signal line; and
   the electromagnetic shielding structure is disposed on the side of the adaptor flexible printed circuit board facing the main flexible printed circuit board, and in the overlapping region, the electromagnetic shielding structure comprises a second conductive part disposed in the fifth conductive layer, wherein the second conductive part is grounded.

2. The flexible printed circuit board according to claim 1, wherein the main flexible printed circuit board comprises a first substrate layer, a first conductive layer disposed on a first surface of the first substrate layer, and a second conductive layer disposed on a second surface of the first substrate layer opposite to the first surface; wherein the first surface is a surface of the first substrate layer close to the adaptor flexible printed circuit board, the first conductive layer comprises the first signal line, and the second conductive layer comprises the second signal line; and
   the electromagnetic shielding structure is disposed on the side of the main flexible printed circuit board facing the adaptor flexible printed circuit board, and in the overlapping region, the electromagnetic shielding structure comprises a first conductive part disposed in the first conductive layer, wherein the first conductive part is insulated from the first signal line, and the first conductive part is grounded.

3. The flexible printed circuit board according to claim 1, wherein the adaptor flexible printed circuit board comprises a second substrate layer, and a third conductive layer disposed on a third surface of the second substrate layer, wherein the third surface is a surface of the second substrate layer facing away from the main flexible printed circuit board, and the third conductive layer comprises the third signal line.

4. The flexible printed circuit board according to claim 1, wherein in the overlapping region, the electromagnetic shielding structure comprises:

a first electromagnetic shielding layer disposed on the side of the main flexible printed circuit board facing the adaptor flexible printed circuit board;

and/or a second electromagnetic shielding layer disposed on the side of the adaptor flexible printed circuit board facing the main flexible printed circuit board.

5. The flexible printed circuit board according to claim 4, wherein the main flexible printed circuit board comprises a first covering film disposed on the side of the main flexible printed circuit board facing the adaptor flexible printed circuit board; and the first electromagnetic shielding layer is disposed on a side of the first covering film close to the adaptor flexible printed circuit board.

6. The flexible printed circuit board according to claim 4, wherein the first electromagnetic shielding layer is one or more of conductive rubber, conductive cloth, conductive foam or conductive shielding glue; and the second electromagnetic shielding layer is one or more of the conductive rubber, the conductive cloth, the conductive foam or the conductive shielding glue.

7. The flexible printed circuit board according to claim 1, wherein the main flexible printed circuit board and the adaptor flexible printed circuit board are connected in the first connection region and the second connection region by one of a board-to-board (BTB) connector, a zero-insertion-force (ZIF) connector or FOF bonding.

8. The flexible printed circuit board according to claim 2, wherein the flexible printed circuit board comprises a second covering film on a side of the second conductive layer facing away from the first substrate layer.

9. The flexible printed circuit board according to claim 3, wherein the adaptor printed circuit board comprises a third covering film on a side of the third conductive layer facing away from the second substrate layer.

10. A display apparatus, comprising:

a display panel; and a flexible printed circuit board, wherein the flexible printed circuit board comprises a main flexible printed circuit board and an adaptor flexible printed circuit board; wherein the main flexible printed circuit board is a single-layer board or a double-layer board, and comprises:

a bonding region configured for bonding with a display panel;

a component arranging region configured for arranging a control component;

a first connection region configured for connecting with the adaptor flexible printed circuit board;

a first signal line disposed between the component arranging region and the first connection region; and a second signal line disposed between the component arranging region and the bonding region;

the adaptor flexible printed circuit board has an outline different from an outline of the main flexible printed circuit board, the adaptor flexible printed circuit board is a single-layer board or a double-layer board, and the adaptor flexible printed circuit board comprises:

a second connection region configured for connecting with the main flexible printed circuit board;

a third connection region configured for connecting with a printed circuit board; and a third signal line disposed between the second connection region and the third connection region;

wherein an orthographic projection of the second connection region on the main flexible printed circuit board completely falls within a region range of the main flexible printed circuit board, and an orthographic projection of the third connection region on a plane of the main flexible printed circuit board does not fall within the region range of the main flexible printed circuit board;

the main flexible printed circuit board and the adaptor flexible printed circuit board are connected through the first connection region and the second connection region, an orthographic projection of the third signal line on the main flexible printed circuit board and the second signal line have an overlapping region; wherein in the overlapping region, an electromagnetic shielding structure is at least disposed on a side of the main flexible printed circuit board facing the adaptor flexible printed circuit board or on a side of the adaptor flexible printed circuit board facing the main flexible printed circuit board;

wherein the adaptor flexible printed circuit board comprises a third substrate layer, a fourth conductive layer disposed on a fourth surface of the third substrate layer, and a fifth conductive layer disposed on a fifth surface of the third substrate layer opposite to the fourth surface, wherein the fifth surface is a surface of the third substrate layer close to the main flexible printed circuit board, and the fourth conductive layer comprises the third signal line; and the electromagnetic shielding structure is disposed on the side of the adaptor flexible printed circuit board facing the main flexible printed circuit board, and in the overlapping region, the electromagnetic shielding structure comprises a second conductive part disposed in the fifth conductive layer, wherein the second conductive part is grounded.

11. The display apparatus according to claim 10, wherein the display panel comprises:

pixel units arranged in an array; and a first functional line electrically connected with the pixel units, wherein the first functional line is electrically connected with the third signal line on the flexible printed circuit board through the bonding region, and the first functional line is configured to receive a display signal from the flexible printed circuit board.

12. The display apparatus according to claim 11, wherein the display panel further comprises:

a touch layer, disposed on a side of the pixel units away from a base substrate, and comprises a plurality of first touch electrodes and a plurality of second touch electrodes; and a second functional line electrically connected with the first touch electrodes; and a third functional line electrically connected with the second touch electrodes;

wherein the second functional line is electrically connected with a first sub-line in the second signal line on the flexible printed circuit board through the bonding region, the third functional line is electrically connected with a second sub-line in the second signal line on the flexible printed circuit board through the bonding region, wherein, one of the second functional line and the third functional line is configured to receive a touch signal, and the other of the second functional line and the third functional line is configured to send the touch signal.

13. The display apparatus according to claim 10, wherein the main flexible printed circuit board comprises a first substrate layer, a first conductive layer disposed on a first surface of the first substrate layer, and a second conductive layer disposed on a second surface of the first substrate layer opposite to the first surface; wherein the first surface is a surface of the first substrate layer close to the adaptor flexible printed circuit board, the first conductive layer comprises the first signal line, and the second conductive layer comprises the second signal line; and the electromagnetic shielding structure is disposed on the side of the main flexible printed circuit board facing the adaptor flexible printed circuit board, and in the overlapping region, the electromagnetic shielding structure comprises a first conductive part disposed in the first conductive layer, wherein the first conductive part is insulated from the first signal line, and the first conductive part is grounded.

14. The display apparatus according to claim 10, wherein the adaptor flexible printed circuit board comprises a second substrate layer, and a third conductive layer disposed on a third surface of the second substrate layer, wherein the third surface is a surface of the second substrate layer facing away from the main flexible printed circuit board, and the third conductive layer comprises the third signal line.

15. The display apparatus according to claim 10, wherein in the overlapping region, the electromagnetic shielding structure comprises:

a first electromagnetic shielding layer disposed on the side of the main flexible printed circuit board facing the adaptor flexible printed circuit board;
and/or
a second electromagnetic shielding layer disposed on the side of the adaptor flexible printed circuit board facing the main flexible printed circuit board.

16. The display apparatus according to claim 15, wherein the main flexible printed circuit board comprises a first covering film disposed on the side of the main flexible printed circuit board facing the adaptor flexible printed circuit board; and the first electromagnetic shielding layer is disposed on a side of the first covering film close to the adaptor flexible printed circuit board.

17. The display apparatus according to claim 15, wherein the first electromagnetic shielding layer is one or more of conductive rubber, conductive cloth, conductive foam or conductive shielding glue; and the second electromagnetic shielding layer is one or more of the conductive rubber, the conductive cloth, the conductive foam or the conductive shielding glue.

18. The display apparatus according to claim 10, wherein the main flexible printed circuit board and the adaptor flexible printed circuit board are connected in the first connection region and the second connection region by one of a board-to-board (BTB) connector, a zero-insertion-force (ZIF) connector or FOF bonding.

* * * * *